US012609288B1

(12) United States Patent
Zavaliche et al.

(10) Patent No.: US 12,609,288 B1
(45) Date of Patent: Apr. 21, 2026

(54) SPUTTERING TARGETS, AND RELATED APPARATUSES AND METHODS

(71) Applicant: Seagate Technology LLC, Fremont, CA (US)

(72) Inventors: Florin Zavaliche, San Ramon, CA (US); Robin Davies, Livermore, CA (US); Thomas Larson Greenberg, Berkeley, CA (US); Chun Wai Joseph Tong, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 496 days.

(21) Appl. No.: 17/592,339

(22) Filed: Feb. 3, 2022

(51) Int. Cl.
*H01J 37/34* (2006.01)
*C23C 14/34* (2006.01)

(52) U.S. Cl.
CPC ...... *H01J 37/3497* (2013.01); *C23C 14/3407* (2013.01); *C23C 14/3471* (2013.01); *H01J 37/3435* (2013.01)

(58) Field of Classification Search
CPC .............. H01J 37/3497; H01J 37/3435; C23C 14/3407; C23C 14/3471
See application file for complete search history.

(56) References Cited

U.S. PATENT DOCUMENTS

| | | | | |
|---|---|---|---|---|
| 5,039,913 | A * | 8/1991 | Wegmann | ........... H01J 37/3408 204/192.12 |
| 5,855,745 | A * | 1/1999 | Manley | .................... C23C 14/35 204/298.18 |
| 6,183,614 | B1 | 2/2001 | Fu | |
| 6,197,165 | B1 * | 3/2001 | Drewery | ........... H01J 37/32477 204/192.12 |
| 6,274,008 | B1 | 8/2001 | Gopalraja et al. | |
| 6,635,154 | B2 | 10/2003 | Johnson et al. | |
| 6,709,557 | B1 * | 3/2004 | Kailasam | ............ H01J 37/3429 204/298.12 |
| 6,758,948 | B2 | 7/2004 | Johnson | |
| 7,767,064 | B2 | 8/2010 | Pavloff et al. | |
| 8,968,536 | B2 | 3/2015 | Allen et al. | |
| 9,865,440 | B1 | 1/2018 | Kassela et al. | |
| 10,184,170 | B2 | 1/2019 | Tanaka et al. | |
| 10,636,634 | B2 | 4/2020 | Tsunekawa et al. | |
| 10,697,056 | B2 | 6/2020 | Shin et al. | |

(Continued)

FOREIGN PATENT DOCUMENTS

| | | | | | |
|---|---|---|---|---|---|
| CN | 111349897 | A * | 6/2020 | ......... | C23C 14/3414 |
| DE | 10234856 | A1 | 2/2004 | | |
| WO | 2017016575 | A1 | 2/2017 | | |

OTHER PUBLICATIONS

CN-111349897-A Translation (Year: 2020).*

*Primary Examiner* — Patrick S Ott
(74) *Attorney, Agent, or Firm* — Mueting Raasch Group

(57) ABSTRACT

The present disclosure relates to target plates for sputtering a material to form a layer of material on a substrate. In some embodiments, a target plate is made up of two or more discrete sections and/or has at least one recess to help reduce or avoid hotspots created by a rotating plasma ring created during sputtering. The present disclosure also relates to methods of actively heating and/or cooling different regions of a heat-sink backing plate while sputtering material to reduce or avoid hotspots created by a rotating plasma ring created during sputtering.

7 Claims, 12 Drawing Sheets

(56)  References Cited

U.S. PATENT DOCUMENTS

2002/0053512 A1*   5/2002   Grohman ............ C23C 14/3407
                                                  204/192.1
2002/0100680 A1*   8/2002   Yamamoto .......... H01J 37/3497
                                                  204/192.12
2005/0236270 A1   10/2005   Cheng et al.
2006/0065517 A1*   3/2006   Ivanov ................ C23C 14/3414
                                                  204/192.12
2006/0219546 A1*  10/2006   Jan ...................... C23C 14/3414
                                                  204/192.1
2007/0051617 A1*   3/2007   White ................ H01J 37/3408
                                                  204/192.1
2007/0158181 A1    7/2007   Yi et al.
2007/0187234 A1*   8/2007   Kadokura ........... H01J 37/3405
                                                  204/298.02
2008/0308416 A1*  12/2008   Allen ...................... H04L 65/80
                                                  427/307
2011/0290638 A1   12/2011   Torii et al.
2012/0055787 A1*   3/2012   Ohba .................. C23C 14/3414
                                                  204/298.12
2013/0270104 A1*  10/2013   Yang .................... C23C 14/352
                                                  204/192.1
2014/0174918 A1*   6/2014   Yang .................. H01J 37/3497
                                                  204/298.16
2016/0247532 A1    8/2016   Tanaka et al.
2017/0338087 A1*  11/2017   Parker ................ H01J 37/3435

* cited by examiner

SPUTTERING TARGETS, AND RELATED APPARATUSES AND METHODS

BACKGROUND

The present disclosure relates to target plates used in sputtering apparatuses and processes. There is a continuing need to solve problems related to prevent target plates from failing (e.g., cracking), for example, due to stresses that can be caused by overheating when, for example, relatively high sputter powers are used.

SUMMARY

The present disclosure includes embodiments of a segmented, target plate including:

material to be deposited onto a substrate via a sputtering process;

a first major surface adapted to be in direct or indirect contact with a major surface of a heat-sink backing plate of a sputtering apparatus;

a second major surface opposite the first major surface; and two or more discrete sections in physical contact to form the segmented target plate having the first major surface and the second major surface.

The present disclosure also includes embodiments of a sputter apparatus and/or a method of sputtering that includes a segmented, target plate as described herein.

The present disclosure also includes embodiments of a target plate including:

material to be deposited onto a substrate via a sputtering process;

a first major surface adapted to be in direct or indirect contact with a major surface of a heat-sink backing plate of a sputtering apparatus, wherein the first major surface includes one or more recesses; and a second major surface opposite the first major surface.

The present disclosure also includes embodiments of a sputter apparatus and/or a method of sputtering that includes a target plate having one or more recesses as described herein.

The present disclosure also includes embodiments of a method of adjusting a temperature of a target plate during a sputtering process, wherein the method includes:

providing a sputtering apparatus including:

a chamber;

a heat-sink backing plate positioned in the chamber, wherein the heat-sink backing plate includes a first major surface and a second major surface, wherein the first major surface is physically coupled to the apparatus, and wherein the apparatus and heat-sink backing plate are configured to actively heat and/or cool at least a first region of the beat-sink backing plate independently from at least a second region of the heat-sink backing plate;

at least one target plate positioned in the chamber, wherein the at least one target plate includes:

material to be deposited onto a substrate via a sputtering process;

a first major surface facing and secured, directly or indirectly, to the second major surface of the heat-sink, backing plate; and a second major surface opposite the first major surface;

a substrate holder positioned in the chamber, wherein the substrate holder is configured to secure the substrate at a location in the chamber to permit material to be sputtered from the at least one segmented target plate onto the substrate;

a gas energizer coupled the chamber and adapted to ionize a gas and form a plasma in the chamber to sputter the material from the second major surface of the at least one segmented target plate and deposit the material onto the substrate, wherein the apparatus is configured to receive the gas inside the chamber from a source; and an electromagnetic field generator electromagnetically coupled to the chamber and adapted to increase an ion density of plasma adjacent to at least a portion of the second major surface of the segmented target plate;

sputtering material from the second major surface of the at least one target plate by causing ionized gas to impinge the at least one target plate; and actively heating or cooling the first region of the heat-sink backing plate while sputtering material and while not actively heating or cooling the second region of the heat-sink backing plate the same as the first region.

DETAILED DESCRIPTION

The present disclosure relates to target plates that can be used in sputtering apparatuses to sputter material onto a substrate, and related processes.

Sputtering apparatuses and processes cause gaseous ions to energetically impinge upon and bombard a sputtering surface of the target plate to sputter material off of the surface and onto a substrate to form a film. Sputtering can be used to form a wide variety of films, including multilayer structures made of films having a variety of thickness such as in magnetic data storage disks used in hard disk drives. Nonlimiting examples of sputtering apparatuses and processes are described in U.S. Pat. No. 9,865,440 (Kassela et al.) and 10,184,170 (Tanaka et al.); and U.S. Pub. Nos. 2007/0158181 (Yi et al.); 2011/0290638 (Torii et al.); and 2016/0247532 (Tanaka et al.); wherein the entirety of each of said patents and patent publications is incorporated herein by reference.

Figure 1:
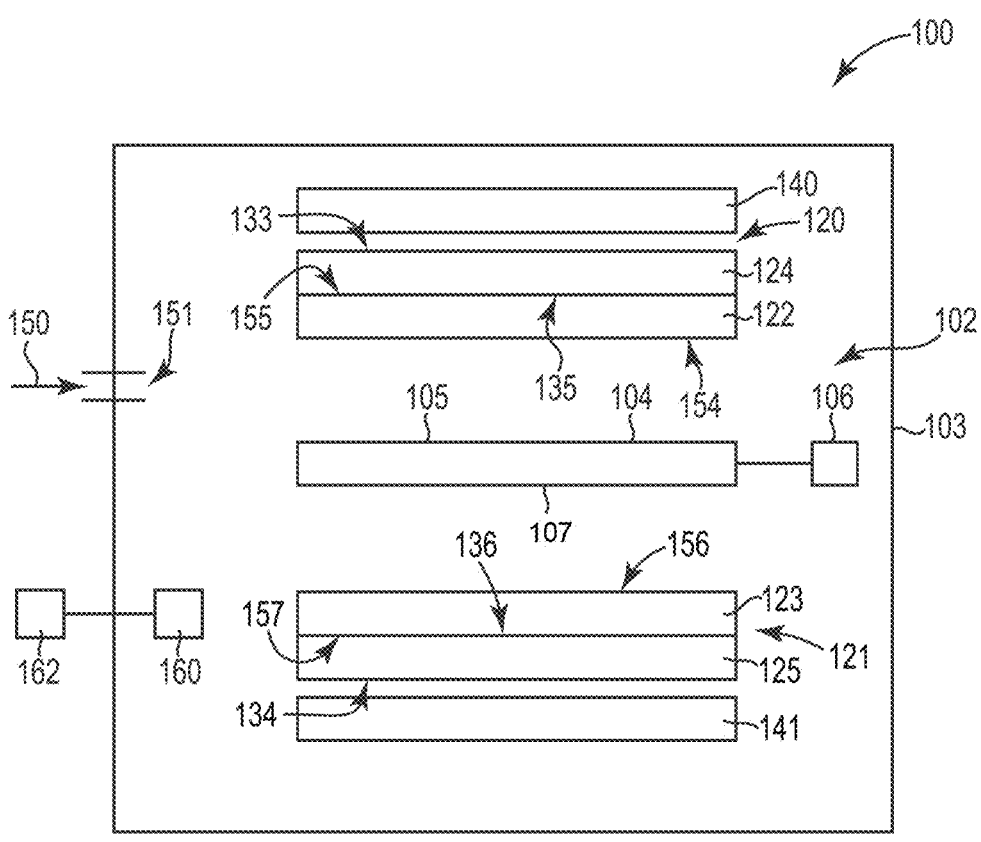
FIG. 1 is a sketch of an elevation view of a non-limiting example of a sputter apparatus that includes a target plate for sputtering material onto a substrate.

A non-limiting example of a sputter apparatus that includes a target plate is described herein below with respect to FIG. 1. FIG. 1 is a simplified block diagram of components that can be included in a sputter apparatus. The sputter apparatus 100, also known as a physical vapor deposition (PVD) apparatus, is capable of sputter depositing material onto a substrate 104, which is held by a substrate support 106. As shown in FIG. 1, a sputtering apparatus 100 includes a sputtering chamber 102 defined by enclosure walls 103. The sputter apparatus 100 includes two sputtering target assemblies 120 and 121, which are located on opposite sides of substrate 104.

The sputtering target assembly 120 is positioned inside the chamber 102 and includes a target plate 122 and heat-sink backing plate 124. The heat-sink backing plate 124 includes a first major surface 133 and a second major surface 135. The first major surface 133 is physically coupled to the apparatus 100. The target plate 122 includes a first major surface 155 and a second major surface 154 opposite the first major surface 155. The first major surface 155 of the target plate 122 is secured, directly or indirectly, to the second major surface 135 of the heat-sink, backing plate 124 via a suitable fastening technique such as a clamp ring (not shown). The second major surface 154 faces major surface 105 of substrate 104.

The sputtering target assembly 121 is positioned inside the chamber 102 and includes a target plate 123 and heat-sink backing plate 125. The heat-sink backing plate 125 includes a first major surface 134 and a second major surface 136. The first major surface 134 is physically coupled to the apparatus 100. The target plate 123 includes a first major surface 157 and a second major surface 156 opposite the first major surface 157. The first major surface 157 of the target plate 123 is secured, directly or indirectly, to the second major surface 136 of the heat-sink, backing plate 125 via a suitable fastening technique such as a clamp ring (not shown). The second major surface 156 faces major surface 107 of substrate 104.

Target plates can have a variety of shapes, sizes, and materials. In some embodiments, target plates can be made out of metallic material or composite material. Non-limiting examples of metallic materials include aluminum, copper, tantalum, titanium and tungsten or other materials. A target plate such as 122 can have variety of cross-sectional profiles that are parallel to the first 155 and second 154 major surfaces. Non-limiting examples of such profiles include circular and square. And target plates can have a range of sizes. In some embodiments, a target plate having a circular cross-sectional profile can have a diameter of 2 inches or greater, 3 inches or greater, 4 inches or greater, or even 5 inches or greater. In some embodiments, a target plate can have a diameter from 4-12 inches, or even from 4-10 inches.

As shown in FIG. 1, apparatus 100 also includes a substrate holder 106 positioned in the chamber 102 to secure a substrate 104 at a location in the chamber 102 to permit material to be sputtered from the second major surface 154 of the target plate 122 onto the substrate 104.

The chamber 102 can be a part of a multi-chamber platform (not shown) having a cluster of interconnected chambers connected by a substrate transfer mechanism, such as a robot arm, which transfers substrate 104 between the chambers.

As schematically represented in FIG. 1, apparatus 100 also includes a gas energizer 160 coupled the chamber 102 and adapted to ionize a gas and form a plasma in the chamber 102 to sputter the material from the second major surface 154 of the target plate 122 and second major surface 156 of the target plate 123 and deposit the material onto the substrate 104. The apparatus 100 is configured to receive the gas inside the chamber 102 from a source (not shown).

One or more gases, alone or a mixture thereof can be used to sputter material from target plates 122 and 123. Non-limiting examples of gases include inert gases such as argon or krypton and gases such as nitrogen or oxygen that can react with sputtered material.

In operation, a gas is introduced into the chamber 102 through an outlet 151 of a gas supply 150 that includes a gas source. The outlet 151 can be connected to a gas source by conduits having one or more gas flow control valves (not shown) such as mass flow controllers and the like. The pressure in the chamber 102 can be controlled by controlling the flow of gas to the chamber using gas flow control valves. In one version, the gas outlet 151 is located about a periphery of the substrate 104. The pressure of the sputtering gas in the chamber 102 can be several orders of magnitude below atmospheric levels.

As mentioned, the gas can be energized to sputter material from the target plates 122 and 123 by using the gas energizer 160. For example, the gas energizer 160 may include process electrodes that may be powered by a power supply 162 to energize the gas. The process electrodes may include an electrode that is on a wall in the process chamber 102, such as a sidewall 103, or substrate support 106, and may be capacitively coupled to another electrode, such as the targets 122 and 123. The targets 122 and 123 may be electrically biased with respect to the other components to energize the gas so that it ionizes and forms a plasma that sputters material from each of the targets 122 and 123 onto the substrate 104. The resultant plasma formed in the chamber 102 energetically impinges upon and bombards the sputtering surface 154 of the target 122 and surface 156 of the target 123 to sputter material off of the surfaces and onto the substrate 104.

Gas can be removed or exhausted from the chamber 102 through an exhaust system (not shown). The exhaust system can include an exhaust port in the chamber 102 that is connected to an exhaust conduit leading to an exhaust pump.

As schematically represented in FIG. 1, apparatus 100 also includes an electromagnetic field generators 140 and 141 electromagnetically coupled to the chamber 102 and adapted to increase an ion density of plasma adjacent to at least a portion of the second major surface 154 of the target plate 122 and the second major surface 156 of the target plate 123, respectively.

The magnetic field generators 140 and 141 each include a plurality of rotatable magnets (not shown) which are positioned about the backside surface of the heat-sink backing plates 124 and 125, respectively. The magnetic field generators 140 and 141 can each include a motor (not shown) mounted on an axle (not shown) which rotates the magnets. The magnetic field acts on the plasma and causes the energetic ions of the ionized gas to spiral along the field lines. By controlling the strength and shape of the magnetic field, the magnetic field generators 140 and 141 can be used to control the flux of particles onto the surfaces of the target plates 122 and 123, respectively, and the uniformity with which the material is eroded away. A magnetic field generator 140 is described, for example, in U.S. Pat. No. 6,183,614 (Fu); and U.S. Pat. No. 6,274,008 (Gopalraja et al.), both of which are incorporated by reference herein in their entireties.

The apparatus 100 can be controlled by a controller that includes a program code having instruction sets to operate components of the apparatus 100 to process substrate 104 in the chamber 102. For example, a controller can include program code that includes gas flow control instruction sets to operate gas flow control valves to set a flow of sputtering gas to the chamber 102; gas pressure control instruction sets to maintain a pressure in the chamber 102; gas energizer control instruction sets to operate the gas energizer 160 to set a gas energizing power level; magnetic field generator instruction sets to operate the magnetic field generators 140 and 141; temperature control instruction sets to control a temperature to set temperatures of various components in the chamber 102; and process monitoring instruction sets to monitor the process in the chamber 102 via a process monitoring system.

Non-limiting examples of sputtering apparatuses and processes are also reported in U.S. Pat. No. 6,635,154 (Johnson et al.); U.S. Pat. No. 6,758,948 (Johnson); U.S. Pat. No. 7,767,064 (Pavloff et al.); U.S. Pat. No. 8,968,536 (Allen et al.); U.S. Pat. No. 10,636,634 (Tsunekawa et al.); and U.S. Pat. No. 10,697,056 (Shin et al.), wherein the entireties of said patents are incorporated herein by reference.

A sputter apparatus and process can be used to form a variety of films and film thicknesses onto a substrate. The film thickness can depend on the rate at which material is sputtered from the target plate. And the rate at which material is sputtered from a target plate can depend on the power (e.g., in terms of kilowatts) used to generate a plasma. For example, to make relatively thicker films, the power can be increased, and as the power is increased, the sputter rate increases. Increasing the power to make relatively thicker films can unfortunately cause over heating of a target plate due to ion bombardment, which can lead to failure of the target plate because of undue cracking caused by stresses when overheating occurs. A non-limiting example of films that can made with a sputter apparatus include one or more films in data storage media. Data storage media includes magnetic storage media, optical storage media, etc. Magnetic storage media such as magnetic discs may include a substrate on which a non-magnetic underlayer, a magnetic layer and a protective overcoat are deposited by vacuum sputter deposition, followed by application of a thin layer of lubricant.

Figure 2:
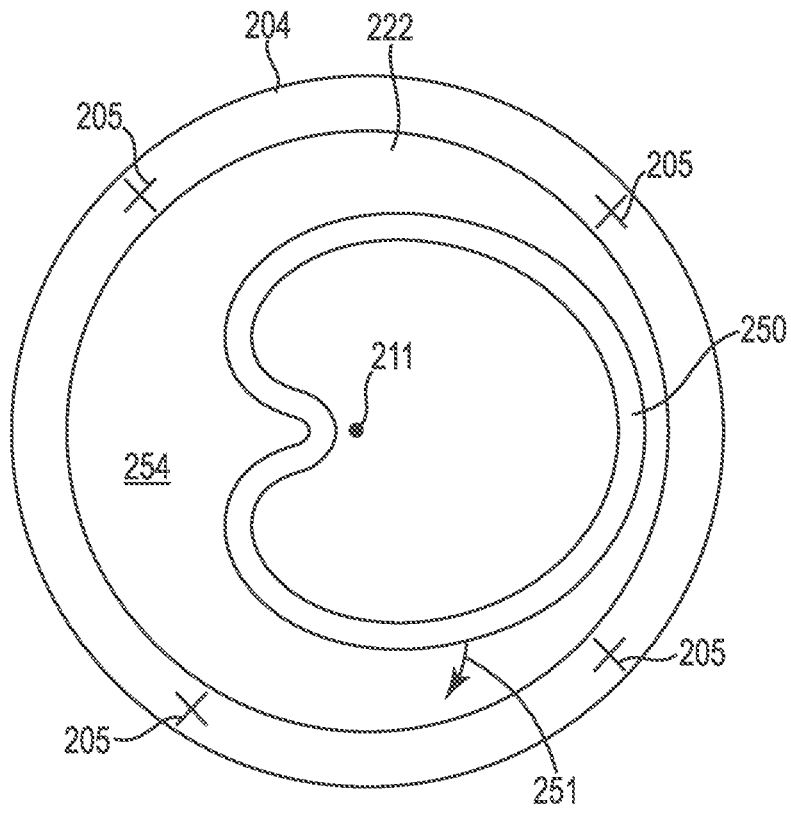
FIG. 2 is a sketch of a top view of a non-limiting example of a rotating plasma ring adjacent to a target plate during sputtering.

While not being bound by theory, it is believed that hotspots can be created in a target plate due to a relatively higher dwell time of area of the target plate covered by a center of rotation of the adjacent plasma ring. For example, FIG. 2 shows a partial, top view of a target plate 222 mounted in a sputtering apparatus with a clamp ring 204 and fasteners 205. During sputtering, a plasma ring 250 rotates around axis 211 and adjacent to surface 254 of the target plate 222. The axis 211 can correspond to any part of target plate 222, but typically corresponds to the center of target plate 222. The plasma ring can rotate at an rpm in the range from 50 to 700 rpm, from 100 to 600 rpm, or even from 150 to 500 rpm. An area of the target plate 222 around the axis 211 of plasma rotation 251 can experience a relatively higher dwell time of exposure to the plasma ring 250 as compared to areas closer to the outer perimeter of target plate 222 and clamp ring 204.

Figure 3:
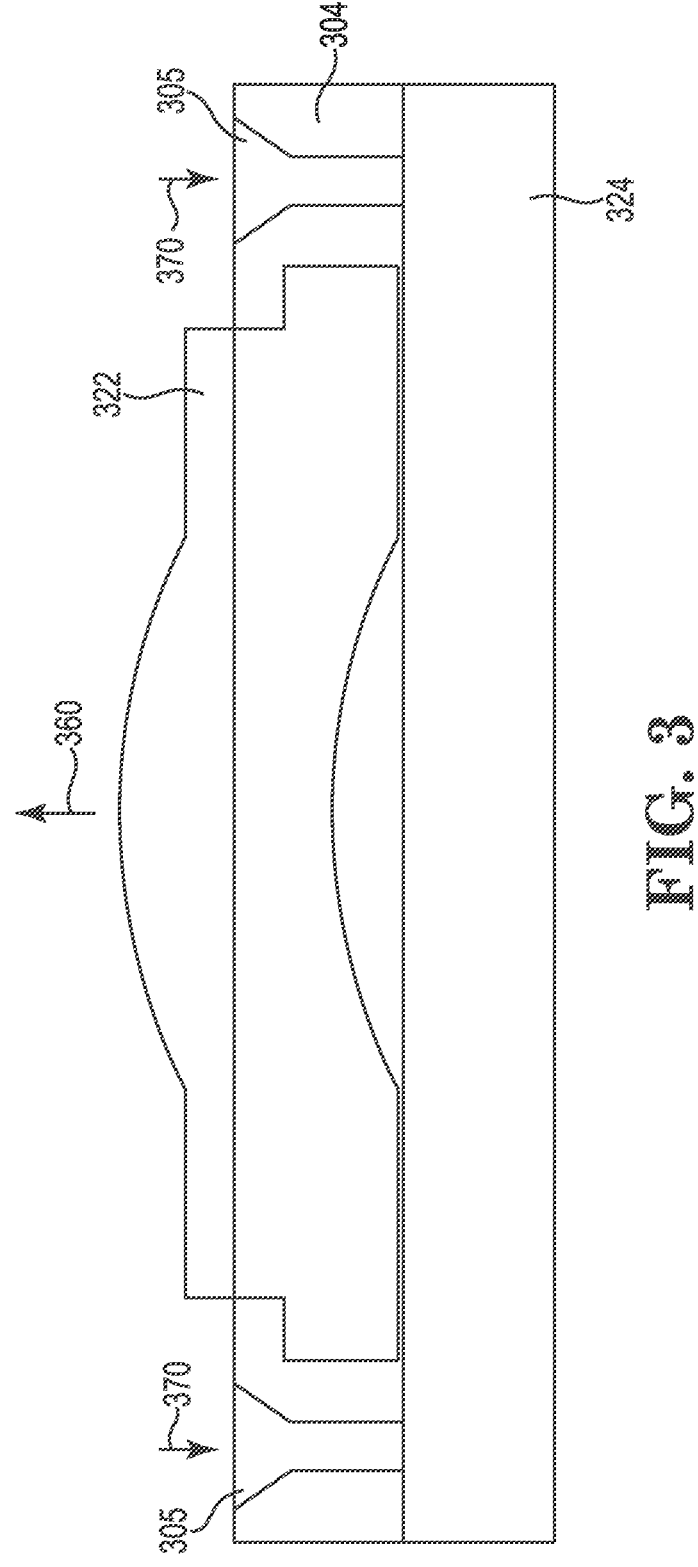
FIG. 3 is a sketch of an elevation view of a non-limiting example of expansion due to a hot spot in a target plate during sputtering.

For example, FIG. 3 shows an elevation view of expansion 360 caused by a hot spot during sputtering in a target plate 322 mounted to a heat-sink backing plate 324 via a clamp ring 304 and fasteners 305. It has been observed that an area around the center of plasma rotation can cause overheating and expansion 360, especially as the power is increased and exposure time to a rotating plasma ring is increased for the purpose of forming relatively thicker layers on a substate. While not being bound by theory, it is believed the expansion (compressive) force 360 in the center of target plate 322 causes undue constraining (tensile) forces 370 in target plate 322, which leads to cracking and failure of target plate 322. In addition, the expansion 360 can cause target plate 322 to not be in physical contact with the portion of heat-sink backing plate 324 where expansion occurs, thereby disrupting heat transfer from target plate 322 to heat-sink backing plate 324.

Providing a target plate in two or more discrete sections to form a "segmented" target plate can provide stress relief and avoid cracking of the target plate. As used herein, a "segmented" target plate refers to a target plate that includes two or more discrete sections that conform in shape to surfaces of adjacent section(s) so to form a whole target plate when position adjacent to each other in physical and thermal contact, but that are not physically and/or chemically attached to each other (e.g., adhesives, etc.) so that undue stress forces are avoided if hotspots are created due to thermal gradients caused by unequal dwell time across the whole target plate with respect to a rotating plasma as described herein above with respect to FIG. 2.

A segmented, target plate can include a plurality (two or more) of discrete sections. A wide variety of number and geometry of discrete sections can be selected depending on, e.g., where a hot spot may be created, which as discussed above can depend on the axis of rotation of an adjacent plasma ring. In some embodiments, a segmented, target plate can include 2 discrete sections, 3 discrete sections, 4 discrete sections, 5 discrete sections, 6 discrete sections, 7 discrete sections, 8 discrete sections, 9 discrete portions, 10 discrete sections, etc.

Figure 4A:
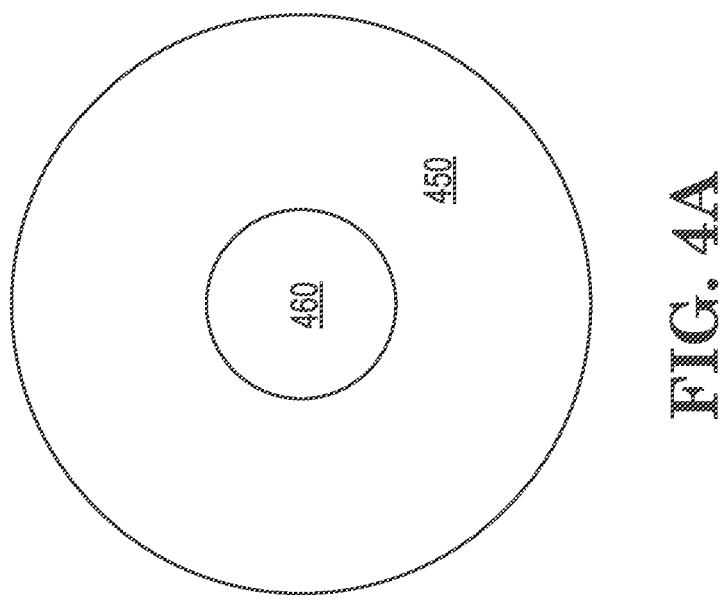
FIG. 4A shows a top view of a segmented, target plate that includes two discrete sections according to the present disclosure.

FIG. 4A shows a top view of one embodiment of a segmented, target plate according to the present disclosure that includes 2 discrete sections. As can be seen, the discrete section 460 includes a central region of the target plate 422 and is selected to cover a region that would be overheated relative to the periphery of the target plate 422 due to a relatively higher dwell time that the central region may be exposed to a rotating plasma having an axis of rotation that is present in the central region of the target plate 422.

Figure 4B:
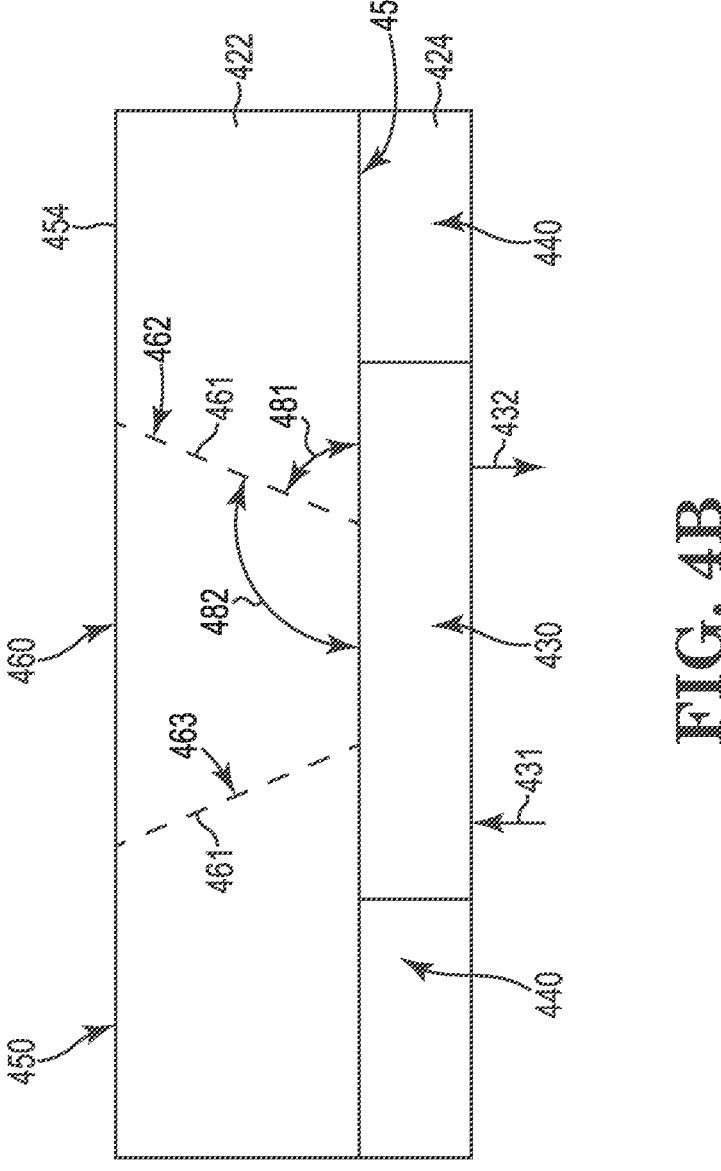
FIG. 4B shows an elevation view of one embodiment of the segmented, target plate shown in FIG. 4A, and temperature control zones in a heat-sink backing plate.

FIG. 4B shows an elevation view of one embodiment of the segmented, target plate shown in FIG. 4A. As shown in FIG. 4B, segmented, target plate 422 includes a first discrete section 450 in physical contact with a second discrete section 460 to form the entire target plate 422 having a major surface 454 and major surface 455. The first discrete section 450 is an annulus having an interior opening that receives second discrete section 460. The shape of the opening in first discrete section 450 conforms to the shape of the outer side wall of second discrete section 460 as indicated by dashed lines 461. As mentioned above, a segmented, target plate can have more than two discrete sections. For example, two or more discrete sections can be in the form of an annulus similar to discrete section 450. A first annulus can form an outermost discrete section (similar to discrete section 450) and one or more additional discrete sections, each in the form of an annulus and relatively smaller diameter, can be positioned within the outermost annulus and with respect to each other. A discrete section similar to second discrete section 460 can be positioned within the innermost annular discrete section so as to form the segmented, target plate.

As can be seen by lines 461 in FIG. 4B, the adjacent sidewalls of each discrete section extend between the major surfaces 454 and 455 of the segmented, target plate 422. The inner sidewall 462 of discrete section 450 along line 461 can form a wide variety of angles 481. In some embodiments, the inner sidewall 462 of discrete section 450 is canted and forms an angle 481 of less than 90 degrees between the inner sidewall of discrete section 450 and major surface 455. For example, the inner sidewall 462 of discrete section 450 forms an angle 481 from 45 to 85 degrees, or even from 50 to 80 degrees. The outer sidewall 463 of discrete section 460 that is adjacent to the inner sidewall 462 of discrete section 450 forms an angle 482 that corresponds to 180 degrees minus angle 481 between the outer sidewall 463 of discrete section 460 and major surface 455. In some embodiments, the inner sidewall 462 of discrete section 450 is canted and forms an angle 481 of greater than 90 degrees between the inner sidewall of discrete section 450 and major surface 455. For example, the inner sidewall 462 of discrete section 450 forms an angle 481 from 95 to 135 degrees, or even from 140 to 100 degrees. The outer sidewall 463 of discrete section 460 that is adjacent to the inner sidewall 462 of discrete section 450 forms an angle 482 that corresponds to 180 degrees minus angle 481 between the outer sidewall 463 of discrete section 460 and major surface 455. In some embodiments, the inner sidewall 462 of discrete section 450 is canted and forms an angle 481 that is 90 degrees between the inner sidewall of discrete section 450 and major surface 455. The outer sidewall 463 of discrete section 460 that is adjacent to the inner sidewall 462 of discrete section 450 also forms an angle 482 that is 90 degrees.

As shown in FIG. 4B, discrete section 460 is in the shape of a truncated cone. That is, the cross-sectional area of discrete section 460 is parallel to the major surface 454 and increases in the direction toward surface 454. Alternatively, the shape of discrete section can be a wide variety of the other shapes. Non-limiting examples include square, rectangular, etc. As described and illustrated with FIG. 4B above, the discrete section 450 has interior sidewalls that conform to the exterior sidewalls of discrete section 460.

Each of the discrete sections 450 and 460 are made of the same material to be sputtered. Alternatively, discrete section 450 could be made of material different from discrete section 460.

The segmented, target plate 422 major surface 455 that is adapted to be in direct or indirect contact with an adjacent major surface of a heat-sink backing plate 424. The segmented, target plate 422 can be mounted to heat-sink backing plate 424 in any desired manner such as with a clamp ring around the outer periphery of discrete section 450. The second discrete section 460 can be held in position due to the magnetic force created by a magnetic field generator. Heat-sink backing plate 424 is further discussed below. Alternatively, or in addition to a magnetic force, a discrete section such as discrete section 460 that is not held in position by a clamp ring can be held in place due to interlocking features such as described below with respect to FIG. 4D.

Figure 4C:
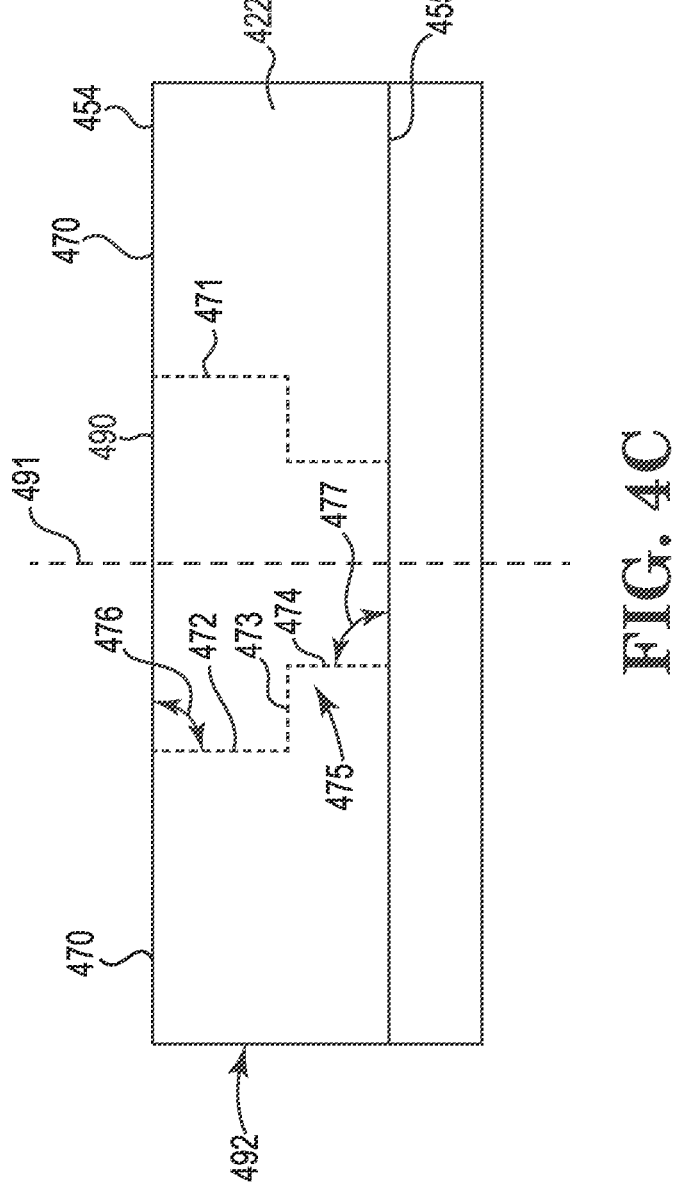
FIG. 4C shows an elevation view of another embodiment of the segmented, target plate shown in FIG. 4A, and temperature control zones in a heat-sink backing plate.

FIG. 4C shows an elevation view of another embodiment of the segmented, target plate shown in FIG. 4A. Features among FIGS. 4B and 4C that relate to the heat-sink backing plate are the same or substantially the same and are not repeated here.

As shown in FIG. 4C, segmented, target plate 422 includes a first discrete section 470 in physical contact with a second discrete section 490 to form the entire target plate 422 having a major surface 454 and major surface 455. The first discrete section 470 is an annulus having an interior opening that receives second discrete section 490. The shape of the inner sidewall of the opening in first discrete section 470 conforms to the shape of the outer side wall of the second discrete section 490 as indicated by dashed lines 471.

As can be seen by dashed lines 471 in FIG. 4C, the adjacent sidewalls of each discrete section extend between the major surfaces 454 and 455 of the segmented, target plate 422, in a "stepped" or "ledged" manner. As shown in FIG. 4C, a first section 472 of the exterior sidewall of the second discrete section 490 extends from the major surface 454 toward ledge 475. A second section 473 extends along ledge 475 from the first section 472 to a third section 474 of the exterior sidewall of second discrete section. The third section 474 extends from ledge 475 to major surface 455. As can be seen, the first section 472 of the sidewall of second discrete section 490 is farther away from centerline axis 491 and closer to perimeter 492 as compared to the third section 474 of the sidewall of second discrete section 490. While FIG. 4C shows a single ledge or step 475, a discrete section according to the present disclosure could include one or more additional ledges/steps. As mentioned above, the shape of the inner sidewall of the opening in first discrete section 470 conforms to the shape of the outer side wall of the second discrete section 490.

As shown in FIG. 4C, each of first section 472 and third section are normal (perpendicular to and form 90 degree angles) to major surfaces 454 and 455, respectively. Alternatively, angle 476 could be less than 90 degrees and angle 477 could be greater than 90 degrees.

Figure 4D:
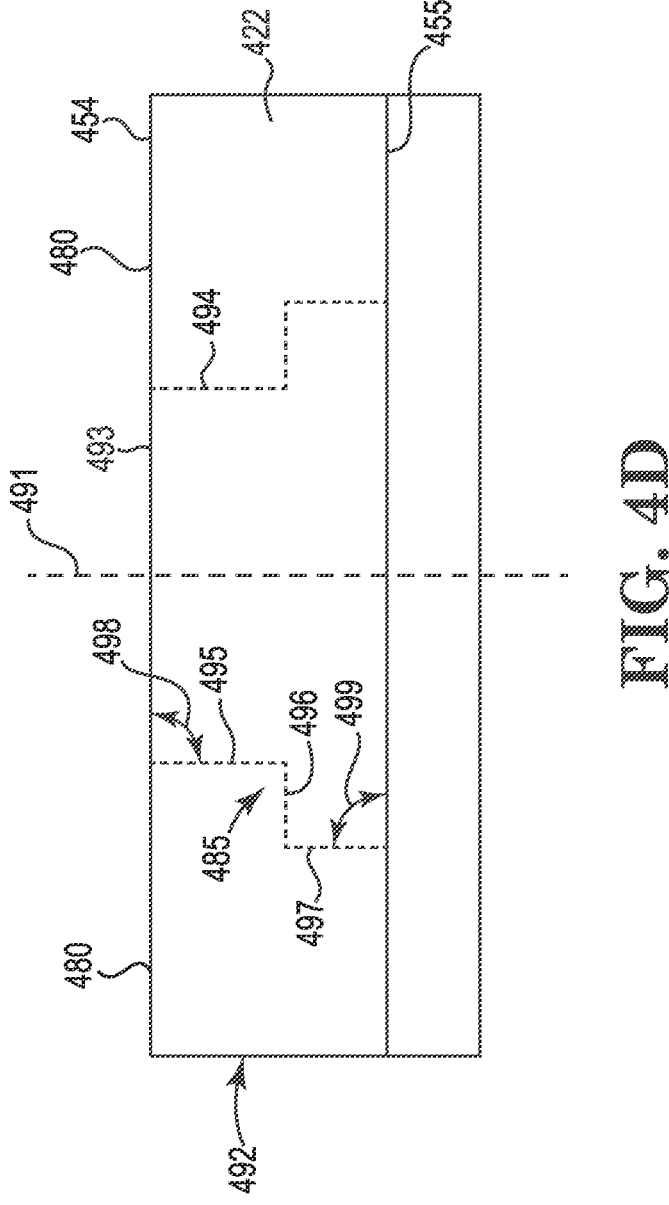
FIG. 4D shows an elevation view of another embodiment of the segmented, target plate shown in FIG. 4A, and temperature control zones in a heat-sink backing plate.

FIG. 4D shows an elevation view of another embodiment of the segmented, target plate shown in FIG. 4A. Features among FIGS. 4B and 4D that relate to the heat-sink backing plate are the same or substantially the same and are not repeated here.

As shown in FIG. 4D, segmented, target plate 422 includes a first discrete section 480 in physical contact with a second discrete section 493 to form the entire target plate 422 having a major surface 454 and major surface 455. The first discrete section 480 is an annulus having an interior opening that receives second discrete section 493. The shape of the inner sidewall of the opening in first discrete section 480 conforms to the shape of the outer side wall of the second discrete section 493 as indicated by dashed lines 494.

As can be seen by dashed lines 494 in FIG. 4D, the adjacent sidewalls of each discrete section extend between the major surfaces 454 and 455 of the segmented, target plate 422, in a "stepped" or "ledged" manner, but in an inverse and interlocking manner as compared to FIG. 4C, which can help secure second discrete section 490 in position. As shown in FIG. 4D, a first section 495 of the exterior sidewall of the second discrete section 493 extends from the major surface 454 toward ledge 485. A second section 496 extends along ledge 485 from the first section 495 to a third section 497 of the exterior sidewall of second discrete section 493. The third section 497 extends from ledge 485 to major surface 455. As can be seen, the first section 495 of the sidewall of second discrete section 493 is closer to the centerline axis 491 and farther away from perimeter 492 as compared to the third section 497 of the sidewall of second discrete section 493. While FIG. 4D shows a single ledge or step 485, a discrete section according to the present disclosure could include one or more additional ledges/steps. As mentioned above, the shape of the inner sidewall of the opening in first discrete section 480 conforms to the shape of the outer side wall of the second discrete section 494.

As shown in FIG. 4D, each of first section 472 and third section are normal (perpendicular to and form 90 degree angles) to major surfaces 454 and 455, respectively. Alternatively, angle 498 could be greater than 90 degrees and angle 499 could be less than 90 degrees.

Figure 5A:
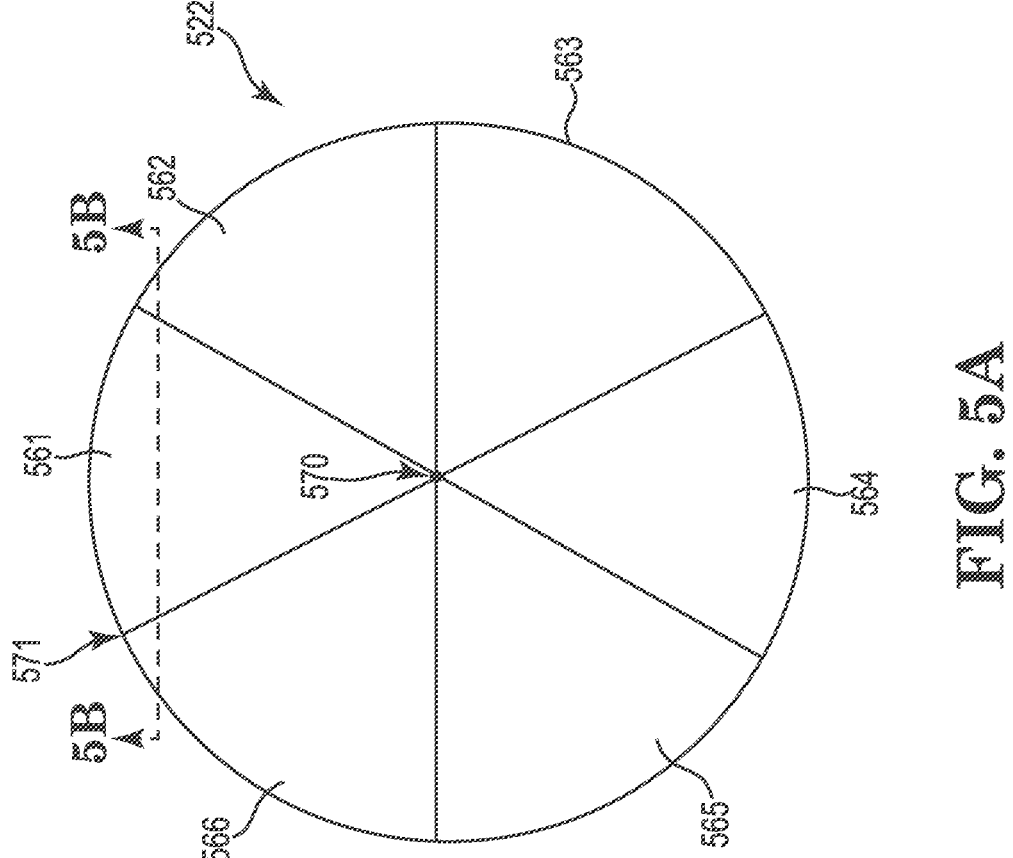
FIG. 5A shows a top view of another embodiment of a segmented, target plate according to the present disclosure.

FIG. 5A shows a top view of another embodiment of a segmented, target plate 522 according to the present disclosure. As shown in FIG. 5A, segmented, target plate 522 includes six discrete sections 561-566, where each discrete section is in physical contact with discrete sections that are adjacent thereto to form the entire target plate 522 having major surfaces 554 and 555. Each of the discrete sections 561-566 have a two sidewalls and each sidewall extends from the top to the bottom of the target plate 522 and from the center 570 to the outer perimeter 571 of the segmented, target plate 522. Each of the discrete sections 561-566 are made of the same material to be sputtered. Alternatively, one or more discrete sections 561-566 could be made of material that is different from one or more other discrete sections.

The segmented, target plate 522 can be mounted to a heat-sink backing plate 524 in any desired manner such as with a clamp ring around the outer periphery of target plate 522.

Figure 5B:
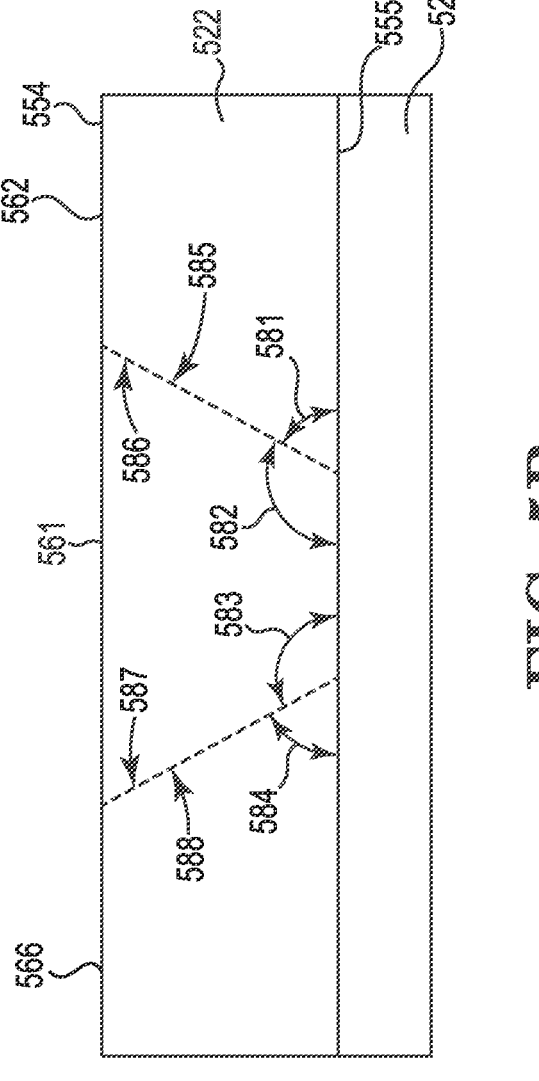
FIG. 5B shows a cross-section view of FIG. 5A.

FIG. 5B shows a cross-section view of FIG. 5A. As can be seen, each of the sidewalls of each of the discrete sections 561-566 can have an angle relative to major surface 555. As shown, the sum of the angles of adjacent sidewalls is 180 degrees. For example, if the angle 581 of sidewall 585 of discrete section 562 is canted (less than or greater than 90 degrees) or 90 degrees, then the angle 582 of adjacent sidewall 586 of discrete section 561 is 180 degrees minus angle 581. Likewise, if the angle 583 of sidewall 587 of discrete section 561 is canted (less than or greater than 90 degrees) or 90 degrees, then the angle 584 of adjacent sidewall 588 of discrete section 566 is 180 degrees minus angle 583.

Figure 5C:
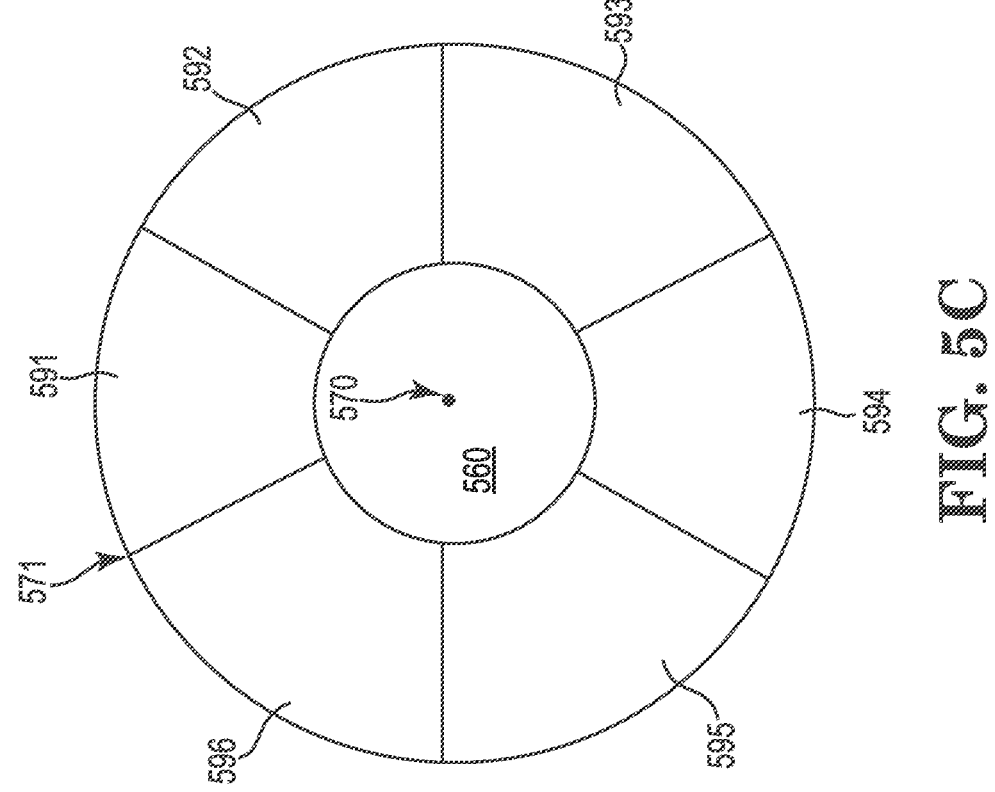
FIG. 5C shows a top view of an alternative embodiment of the segmented, target plate shown in FIG. 5A.

FIG. 5C shows a top view of an alternative embodiment of the segmented, target plate shown in FIG. 5A. As shown in FIG. 5C, a non-limiting example of a plurality of discrete sections according to the present disclosure can include six discrete sections 591-596 and a centrally located discrete section 560, where each discrete section is in physical contact with discrete sections that are adjacent thereto to form the entire target plate 523. Each of the discrete sections 561-566 have a two sidewalls and each sidewall extends from the top to the bottom of the target plate 522 and from the outer perimeter 571 toward the center 570 of the segmented, target plate 522, but less than the radius of the segmented, target plate 522. The six discrete sections 591-596 form an annular ring similar to discrete section 450 and discrete section 560 is positioned within the annular ring similar to discrete section 460 in FIG. 4B. The sidewalls of discrete sections 591-596 and a centrally located discrete section 560 can be canted or 90 degrees as similarly described herein above with respect to FIGS. 4B-4D and 5B.

Providing a target plate with a recess near a hotspot can improve the heat transfer with the heat-sink backing plate. Improving the heat transfer near a hotspot can help manage hotspots that may otherwise be caused by unequal dwell time across the whole target plate with respect to a rotating plasma ring as described herein above with respect to FIG. 2. Reducing or avoiding hotspots can avoid undue stress forces and thereby avoid cracking of the target plate. A target plate with a recess as described herein can be provided in a target plate that is segmented as described herein above or that is not segmented.

Figure 6A:
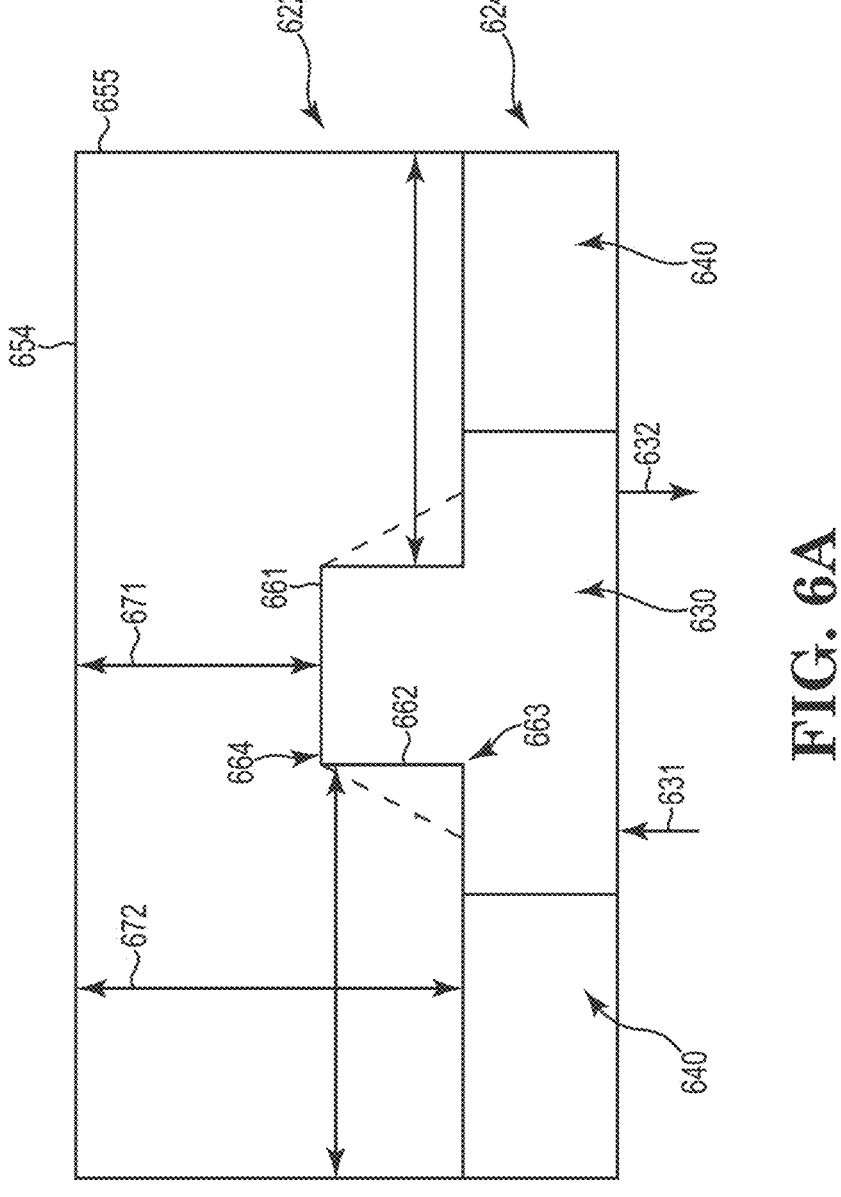
FIG. 6A shows an elevation view of one embodiment of a target plate having a recess according to the present disclosure, and temperature control zones in a heat-sink backing plate.
Figure 6B:
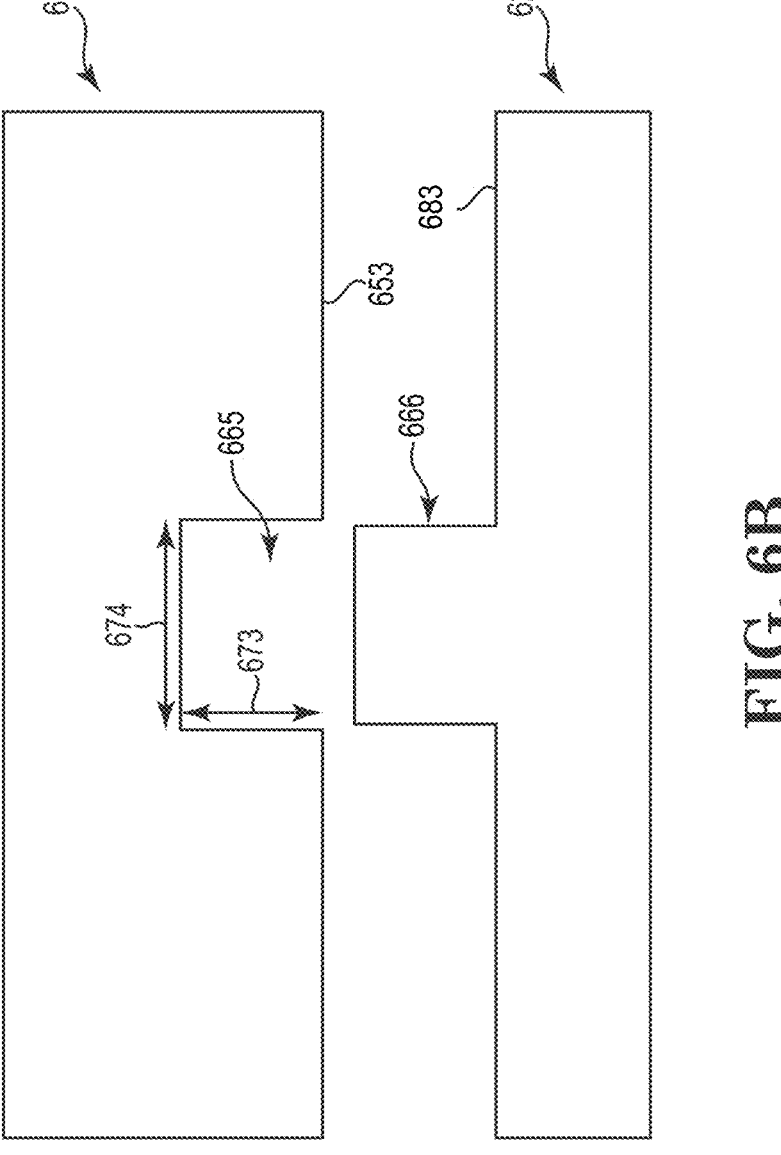
FIG. 6B shows an exploded view of FIG. 6A.

FIGS. 6A and 6B show one embodiment of a target plate having a recess according to the present disclosure. As shown in FIGS. 6A and 6B, target plate 622 includes a first major surface 653 adapted to be in direct or indirect contact with a major surface 683 of a heat-sink backing plate 624 and a second major surface 654 opposite the first major surface 653. As shown in FIG. 6B, the first major surface 653 of the target plate 622 includes a single recess 665 that is selected to be in a location that corresponds to a region that may be overheated relative to other regions of the target plate 622 due to a relatively higher dwell time that the region may be exposed to a rotating plasma having an axis of rotation that is present in the region of the target plate 622. As shown in FIG. 6B, the region that may be exposed to longer dwell times of a plasma corresponds to a central region of the target plate 622 relative to the periphery 655 of the target plate 622.

As shown in FIG. 6B, the major surface 683 of the heat-sink backing plate 624 that faces the recess 665 has a shape in the form of protrusion 666 that conforms to a shape of the recess 665. Having the shape of the heat-sink backing plate 624 that faces the first major surface 653 of the target plate 622 conform to the shape of the first major surface 653 plate 622 conform to the shape of the first major surface 653 (including the recess 665) helps provide desirable heat transfer between target plate 622 and heat-sink backing plate 624.

Although a single recess is shown in FIGS. 6A and 6B, one or more additional recesses could be included in other regions of a target plate.

A recess according to the present disclosure can have a diameter that can depend on one or more factors such as the size of the center of the redeposition zone, and the like. In some embodiments, a recess having a circular profile at the base like base 661 in recess 665 can have a diameter 674 in a range from 0.1 inches to 1 inch, or even from 0.1 inches to 0.5 inches.

As shown in the non-limiting example in FIGS. 6A and 6B, recess 665 has a base 661 having a circular profile and sidewall 662 that intersects with the first major surface 653 at 663 and base 661 at 664.

A recess according to the present disclosure can have a depth that is a fraction of the thickness of the target plate and can depend on one or more factors such as the diameter of the recess (discussed below), the size of the center of the redeposition zone, combinations of these, and the like. The depth is defined as the distance from the plane of first major surface 653 to the farthest point in the recess away from the first major surface 653. As shown in FIG. 6B, the sidewall 662 of the recess 665 corresponds to the depth 673 of recess 665. In some embodiments, a recess according to the present disclosure can have depth from 0.001 inches to 6 inches, from 0.01 inches to 4 inches, or even from 0.1 inches to 2 inches.

A recess according to the present disclosure can have a diameter that can depend on one or more factors such as the size of the center of the redeposition zone, and the like. In some embodiments, a recess having a circular profile at the base like base 661 in recess 665 can have a diameter in a range from 0.1 inches to 1 inch, or even from 0.1 inches to 0.5 inches.

A target plate having one or more recesses according to present disclosure has a thickness that can vary depending on the size of the center of the redeposition zone, and the like. As shown in FIG. 6A, the thickness 671 between the base 661 and the second major surface 654. As also shown in FIG. 6A, die thickness 672 between the first major surface 653 and the second major surface 654 is substantially the same from the recess 665 to the perimeter 622 of the target plate 622.

Adjusting a temperature profile of a target plate during a sputtering process based on the location of one or more potential hotspots can help manage hotspots that may otherwise be caused by unequal dwell time across the whole target plate with respect to a rotating plasma ring as described herein above with respect to FIG. 2. Reducing or avoiding hotspots can avoid undue stress forces and thereby avoid cracking of the target plate.

A nonuniform temperature profile in a target plate that is caused by a rotating plasma ring can be adjusted by selectively heating and/or cooling different regions of an adjacent heat-sink backing plate. For example, if the center of plasma rotation is near the center of an adjacent target plate, a center zone or region of a heat-sink backing plate that corresponds to the location of center of plasma rotation can be cooled while the remaining regions or zones can have their cooling restricted or turned off, or even heated, to make the temperature profile across the target plate more uniform so as to avoid undue stresses that cause the target plate to crack.

FIGS. 4B and 6A each show a non-limiting embodiment of heat-sink backing plate that can be used to selectively adjust the temperature of a corresponding target plate during a sputter process.

Referring to FIG. 4B, the segmented, target plate 422 can be mounted to heat-sink backing plate 424. Heat-sink backing plate 424 is configured to actively heat and/or cool at least a first region 430 of the heat-sink backing plate 424 relative to a second region 440 of the heat-sink backing plate 424. For example, as mentioned above, the discrete section 460 of the adjacent target plate 422 is located in a central region of the target plate 422 and is selected to cover a region that would be overheated relative to the periphery of the target plate 422 due to a relatively higher dwell time that the central region may be exposed to a rotating plasma having an axis of rotation that is present in the central region of the target plate 422. According to the present disclosure, first region 430 of the beat-sink backing plate 424 can be selectively and actively cooled relative to the second region 440 while a plasma ring is rotating adjacent to surface 454 during a sputter process. As shown in FIG. 4B, liquid coolant can be introduced to heat-sink backing plate 424 at inlet 431 and exit at outlet 432. The position of inlet 431 and outlet 432 can be at any desired positioned in heat-sink backing plate 424. The heat-sink backing plate 424 can include a variety of channel configurations (e.g., liquid coolant flowpaths) and features (e g., channel diameter, baffles, and the like) to control the distribution and flow rate of liquid coolant within heat-sink backing plate 424 and among the first region and second region 440. The temperature of the first region 430 and second region 440 can be each be controlled relative to each other to make the temperature profile across the target plate 422 more uniform so as to avoid undue stresses that cause the target plate 422 to crack. For example, the second region 440 can have the flowrate of cooling fluid restricted relative to first region 430 or cooling fluid to second region 410 can not be allowed. Nonlimiting examples of using liquid cooling to cool a target plate are described in U.S. Pub. No. 2005/0236270 (Cheng et al.) and U.S. Pat. No. 6,758,948 (Johnson), wherein the entirety of each of said patent publication and said patent are incorporated herein by reference. Alternatively, second region 440 could even be heated via, for example, an electrical resistance heater or fluid medium.

Referring to FIG. 6A, the target plate 622 can be mounted to heat-sink backing plate 624. Heat-sink backing plate 624 is configured to actively heat and/or cool at least a first region 630 of the heat-sink backing plate 624 relative to second region 640 of the heat-sink backing plate 624. For example, as mentioned above, the recess 665 is located in target plate 622 to correspond to a region that may be overheated relative to other regions of the target plate 622 due to a relatively higher dwell time that the region may be exposed to a rotating plasma having an axis of rotation that is present in the region of the target plate 622. As shown in FIG. 6B, the region that may be exposed to longer dwell times of a plasma corresponds to a central region of the target plate 622 relative to the periphery 655 of the target plate 622. According to the present disclosure, first region 630 of the heat-sink backing plate 624 can be selectively and actively cooled relative to the second region 640 while a plasma ring is rotating adjacent to surface 654 during a sputter process. As shown in FIG. 6A, liquid coolant can be introduced to first region 630 at inlet 631 and exit from first region at outlet 632. The position of inlet 631 and outlet 632 can be at any desired positioned in heat-sink backing plate 624. The heat-sink backing plate 621 can include a variety of channel configurations (e.g., liquid coolant flowpaths) and features (e.g., channel diameter, baffles, and the like) to control the distribution and flow rate of liquid coolant within heat-sink backing plate 624 and among the first region and second region 640. The temperature of the first region 630 and second region 640 can be each be controlled relative to each other to make the temperature profile across the target plate 622 more uniform so as to avoid undue stresses that cause the target plate 622 to crack.

Following are exemplary embodiments of the present disclosure:

1. A segmented, target plate comprising:
    material to be deposited onto a substrate via a sputtering process;
    a first major surface adapted to be in direct or indirect contact with a major surface of a heat-sink backing plate of a sputtering apparatus;
    a second major surface opposite the first major surface; and
    two or more discrete sections in physical contact to form the segmented target plate having the first major surface and the second major surface.

2. The segmented, target plate of embodiment 1, wherein the at least one segmented, target plate comprises:
    a first discrete section; and
    a second discrete section, wherein the second discrete section is in the form of an annulus having an interior opening, and wherein the first discrete section is positioned within the interior opening.

3. The segmented, target plate of embodiment 2, wherein the first discrete section has one or more exterior sidewalls, wherein each exterior sidewall extends from the first major surface to the second major surface, and wherein each exterior sidewall forms an angle between the exterior sidewall and the first major surface, wherein the angle is less than 90 degrees.

4. The segmented, target plate of embodiment 2, wherein the first discrete section has one or more exterior sidewalls, wherein each exterior sidewall extends from the first major surface to the second major surface, and wherein each exterior sidewall forms an angle between the exterior sidewall and the first major surface, wherein the angle is 90 degrees.

5. The segmented, target plate of embodiment 2, wherein the first discrete section has one or more exterior sidewalls, wherein each exterior sidewall extends from the first major surface to the second major surface, and wherein each exterior sidewall forms an angle between the exterior sidewall and the first major surface, wherein the angle is greater than 90 degrees.

6. The segmented, target plate of embodiment 2, wherein the first discrete section has a cross sectional area parallel to the first major surface and second major surface, and wherein the cross-sectional area increases from the first major surface to the second major surface.

7. The segmented, target plate of embodiment 1, wherein the at least one segmented, target plate comprises:
   two or more annular discrete sections, wherein each discrete section is in the form of an annulus having an interior opening, and wherein one or more of the two or more discrete sections are positioned within the interior opening of another of the two or more discrete sections in the form of the annulus; and
   a discrete section positioned within an innermost annular discrete section in the form of an annulus to form the segmented, target plate.

8. The segmented, target plate of embodiment 2, wherein the first discrete section has one or more exterior sidewalls, wherein each exterior sidewall extends from the first major surface to the second major surface, and wherein the exterior sidewall comprises one or more ledges.

9. The segmented, target plate of embodiment 8, wherein the exterior sidewall comprises at least three sections to form at least one ledge, wherein the at least three sections comprise:
   a first section that extends from the second major surface to a second section; and
   a third section extends from the second section to the first major surface to form the at least ledge.

10. The segmented, target plate of embodiment 9, wherein the first section of the exterior sidewall forms a 90 degree angle with the second major surface, and wherein the third section of the exterior sidewall forms a 90 degree angle with the first major surface.

11. The segmented, target plate of embodiment 9, wherein the first section of the exterior sidewall forms an angle with the second major surface that is less than 90 degrees, and wherein the third section of the exterior sidewall forms an angle with the first major surface that is greater than 90 degrees.

12. The segmented, target plate of embodiment 11, wherein the first section of the exterior sidewall of the first discrete section is farther away from a centerline axis of the first discrete section as compared to the third section of the exterior sidewall.

13. The segmented, target plate of embodiment 9 wherein the first section of the exterior sidewall forms an angle with the second major surface that is greater than 90 degrees, and wherein the third section of the exterior sidewall forms an angle with the first major surface that is less than 90 degrees.

14. The segmented, target plate of embodiment 13, wherein the first section of the exterior sidewall of the first discrete section is closer to a centerline axis of the first discrete section as compared to the third section of the exterior sidewall.

15. The segmented, target plate of embodiment 1, wherein the at least one segmented, target plate comprises a plurality of discrete sections, wherein each discrete section has two sidewalls, wherein each side wall extends from the first major surface to the second major surface and from a center of the segmented, target plate to an outer perimeter of the segmented, target plate.

16. The segmented, target plate of embodiment 15, wherein each sidewall forms an angle between the sidewall and the first major surface, wherein the angle is less than 90 degrees, 90 degrees, or greater than 90 degrees.

17. The segmented, target plate of embodiment 1, wherein each of the two or more discrete sections are made of the same material.

18. A sputter apparatus comprising:
   a chamber;
   a heat-sink backing plate positioned in the chamber, wherein the heat-sink backing plate comprises a first major surface and a second major surface, and wherein the first major surface is physically coupled to the apparatus;
   at least one segmented, target plate according to embodiment 1 and positioned in the chamber, wherein the first major surface of the at least one segmented, target plate is secured, directly or indirectly, to the second major surface of the heat-sink, backing plate;
   a substrate holder positioned in the chamber, wherein the substrate holder is configured to secure the substrate at a location in the chamber to permit material to be sputtered from the at least one segmented target plate onto the substrate;
   a gas energizer coupled the chamber and adapted to ionize a gas and form a plasma in the chamber to sputter the material from the second major surface of the at least one segmented target plate and deposit the material onto the substrate, wherein the apparatus is configured to receive the gas inside the chamber from a source; and
   an electromagnetic field generator electromagnetically coupled to the chamber and adapted to increase an ion density of plasma adjacent to at least a portion of the second major surface of the segmented target plate.

19. A target plate comprising:
   material to be deposited onto a substrate via a sputtering process;
   a first major surface adapted to be in direct or indirect contact with a major surface of a heat-sink backing plate of a sputtering apparatus, wherein the first major surface comprises a single recess; and
   a second major surface opposite the first major surface.

20. The target plate of embodiment 19, wherein the recess comprises at least one sidewall that intersects with the first major surface, wherein the target plate has a thickness between the first major surface and the second major surface, wherein the thickness is substantially the same from where the at least one sidewall intersects with the first major surface to a perimeter of the target plate.

21. A sputter apparatus comprising:
   a chamber;
   a heat-sink backing plate positioned in the chamber, wherein the heat-sink backing plate comprises a first major surface and a second major surface, wherein the first major surface is physically coupled to the apparatus;

at least one target plate according to embodiment 19 and positioned in the chamber, wherein the first major surface of the at least one target plate is secured, directly or indirectly, to the second major surface of the heat-sink, backing plate, and wherein the second major surface of the heat-sink backing plate that faces the recess has a shape that conforms to a shape of the recess;

a substrate holder positioned in the chamber, wherein the substrate holder is configured to secure the substrate at a location in the chamber to permit material to be sputtered from the at least one target plate onto the substrate;

a gas energizer coupled the chamber and adapted to ionize a gas and form a plasma in the chamber to sputter the material from the second major surface of the at least one target plate and deposit the material onto the substrate, wherein the apparatus is configured to receive the gas inside the chamber from a source; and an electromagnetic field generator electromagnetically coupled to the chamber and adapted to increase an ion density of plasma adjacent to at least a portion of the second major surface of the target plate.

22) A method of adjusting a temperature of a target plate during a sputtering process, wherein the method comprises:

providing a sputtering apparatus comprising:
   a chamber;
   a heat-sink backing plate positioned in the chamber, wherein the heat-sink backing plate comprises a first major surface and a second major surface, wherein the first major surface is physically coupled to the apparatus, and wherein the apparatus and heat-sink backing plate are configured to actively heat and/or cool at least a first region of the heat-sink backing plate independently from at least a second region of the heat-sink backing plate;
   at least one target plate positioned in the chamber, wherein the at least one target plate comprises:
   material to be deposited onto a substrate via a sputtering process;
   a first major surface facing and secured, directly or indirectly, to the second major surface of the heat-sink, backing plate; and
   a second major surface opposite the first major surface;
   a substrate holder positioned in the chamber, wherein the substrate holder is configured to secure the substrate at a location in the chamber to permit material to be sputtered from the at least one segmented target plate onto the substrate;
   a gas energizer coupled the chamber and adapted to ionize a gas and form a plasma in the chamber to sputter the material from the second major surface of the at least one segmented target plate and deposit the material onto the substrate, wherein the apparatus is configured to receive the gas inside the chamber from a source; and
   an electromagnetic field generator electromagnetically coupled to the chamber and adapted to increase an ion density of plasma adjacent to at least a portion of the second major surface of the segmented target plate;

sputtering material from the second major surface of the at least one target plate by causing ionized gas to impinge the at least one target plate; and actively heating or cooling the first region of the heat-sink backing plate while sputtering material and while not actively heating or cooling the second region of the heat-sink backing plate the same as the first region.

23. The method of embodiment 22, wherein the first region of the heat-sink backing plate includes a center of the heat-sink backing plate, wherein the first region is actively cooled, and wherein the second region is not actively heated and not actively cooled.

24. The method of embodiment 22, wherein the at least one target plate comprises the segmented, target plate according to embodiment 1, wherein at least one of the discrete sections overlie the first region of the heat-sink backing plate, and wherein the first region is actively cooled, and wherein the second region is not actively heated and not actively cooled.

25. The method of embodiment 23, wherein the at least one target plate comprises the target plate according to embodiment 11, wherein the recess overlies the first region of the heat-sink backing plate, and wherein the first region is actively cooled, and wherein the second region is not actively heated and not actively cooled.

What is claimed is:

1. A sputtering apparatus comprising:

a chamber;

at least one segmented, target plate positioned in the chamber, wherein the at least one segmented, target plate comprises:

material to be deposited onto a substrate via a sputtering process;

a first major surface;

a second major surface opposite the first major surface;

two or more discrete sections in physical contact to form the segmented target plate having the first major surface and the second major surface, wherein the two or more discrete sections comprise:

a first discrete section; and a second discrete section, wherein the second discrete section is in the form of an annulus having an interior opening, wherein the first discrete section is positioned within the interior opening, wherein the first discrete section and the second discrete section each comprise material to be deposited onto the substrate via the sputtering process, and wherein the two or more discrete sections are separable and not attached to each other, wherein the first discrete section has one or more exterior sidewalls, wherein each exterior sidewall extends from the first major surface of the at least one segmented, target plate to the second major surface of the at least one segmented, target plate, and wherein each exterior sidewall forms an angle between the exterior sidewall and the first major surface of the at least one segmented, target plate, wherein the angle is less than 90 degrees; and a heat-sink backing plate positioned in the chamber, wherein the heat-sink backing plate comprises a first major surface and a second major surface, wherein the first major surface of the heat-sink backing plate is physically coupled to the apparatus, and wherein the apparatus and heat-sink backing plate are configured to actively heat and/or cool a first region of the heat-sink backing plate independently from a second region of the heat-sink backing plate, wherein the first region is located adjacent to the first discrete section and the second region is located adjacent to the second discrete section, and wherein the first major surface of the at least one segmented, target plate is facing and secured to the second major surface of the heat-sink backing plate.

2. The sputtering apparatus of claim 1, wherein the first discrete section has a cross sectional area parallel to the first major surface of the at least one segmented, target plate and second major surface of the at least one segmented, target plate, and wherein the cross-sectional area increases from the first major surface of the at least one segmented, target plate to the second major surface of the at least one segmented, target plate.

3. The sputtering apparatus of claim 1, wherein each of the two or more discrete sections are made of the same material.

4. The sputtering apparatus of claim 1, further comprising a gas energizer coupled the chamber and adapted to ionize a gas and form a plasma in the chamber to sputter the material from the second major surface of the at least one segmented target plate and deposit the material onto the substrate, wherein the apparatus is configured to receive the gas inside the chamber from a source, and wherein the gas energizer is configured to electrically couple to a power supply.

5. A sputtering apparatus comprising:
a chamber;
at least one segmented, target plate positioned in the chamber, wherein the at least one segmented, target plate comprises:
material to be deposited onto a substrate via a sputtering process;
a first major surface;
a second major surface opposite the first major surface;
two or more discrete sections in physical contact to form the segmented target plate having the first major surface and the second major surface, wherein the two or more discrete sections comprise:
a first discrete section; and
a second discrete section, wherein the second discrete section is in the form of an annulus having an interior opening, wherein the first discrete section is positioned within the interior opening, wherein the first discrete section and the second discrete section each comprise material to be deposited onto the substrate via the sputtering process, and wherein the two or more discrete sections are separable and not attached to each other, wherein the first discrete section has one or more exterior sidewalls, wherein each exterior sidewall extends from the first major surface of the at least one segmented, target plate to the second major surface of the at least one segmented, target plate, and wherein each exterior sidewall forms an angle between the exterior sidewall and the first major surface of the at least one segmented, target plate, wherein the angle is greater than 90 degrees; and
a heat-sink backing plate positioned in the chamber, wherein the heat-sink backing plate comprises a first major surface and a second major surface, wherein the first major surface of the heat-sink backing plate is physically coupled to the apparatus, and wherein the apparatus and heat-sink backing plate are configured to actively heat and/or cool a first region of the heat-sink backing plate independently from a second region of the heat-sink backing plate, wherein the first region is located adjacent to the first discrete section and the second region is located adjacent to the second discrete section, and wherein the first major surface of the at least one segmented, target plate is facing and secured to the second major surface of the heat-sink backing plate.

6. The sputtering apparatus of claim 5, wherein the first discrete section has a cross sectional area parallel to the first major surface of the at least one segmented, target plate and second major surface of the at least one segmented, target plate, and wherein the cross-sectional area increases from the first major surface of the at least one segmented, target plate to the second major surface of the at least one segmented, target plate.

7. A sputtering apparatus comprising:
a chamber;
a target plate positioned in the chamber, wherein the target plate comprises:
material to be deposited onto a substrate via a sputtering process;
a first major surface, wherein the first major surface comprises a single recess adapted to receive a corresponding protrusion in a first region of a heat-sink backing plate; and
a second major surface opposite the first major surface; and
the heat-sink backing plate positioned in the chamber, wherein the heat-sink backing plate comprises a first major surface and a second major surface, wherein the first major surface of the heat-sink backing plate is physically coupled to the apparatus, and wherein the apparatus and heat-sink backing plate are configured to actively heat and/or cool the first region of the heat-sink backing plate independently from a second region of the heat-sink backing plate, wherein the corresponding protrusion of the heat-sink back plate is disposed in the single recess, wherein the first region is located adjacent to the single recess, wherein the sputtering apparatus is configured to selectively and actively cool the first region relative to the second region, and wherein the first major surface of the target plate is facing and secured to the second major surface of the heat-sink, backing plate.

* * * * *